United States Patent [19]

Elliott

[11] Patent Number: 4,706,819

[45] Date of Patent: Nov. 17, 1987

[54] SUPPORTING ASSEMBLY

[75] Inventor: Kenneth F. Elliott, Ferring, England

[73] Assignee: U.S. Philips Corporation, New York, N.Y.

[21] Appl. No.: 903,042

[22] Filed: Sep. 2, 1986

[30] Foreign Application Priority Data

Sep. 2, 1985 [GB] United Kingdom ................. 8521774

[51] Int. Cl.$^4$ ................................................ A47F 7/00
[52] U.S. Cl. ..................................... 211/41; 361/399; 361/415
[58] Field of Search .................... 211/41, 40; 361/397, 361/399, 412, 413, 415

[56] References Cited

U.S. PATENT DOCUMENTS

| 4,517,625 | 5/1985 | Frink et al. | 361/399 |
| 4,544,066 | 10/1985 | Koppensteiner et al. | 211/41 |
| 4,628,413 | 12/1986 | Speraw | 361/415 |

Primary Examiner—Robert W. Gibson, Jr.
Attorney, Agent, or Firm—Robert T. Mayer

[57] ABSTRACT

An assembly for supporting a body having approximately a predetermined dimension, particularly a printed circuit board (1), comprises a frame (4, 11–14), at least one support member (9), and further support means, suitably another support member (10). An edge (5) of the body (1) is received in a groove (7) extending along and into the support member (9). The body (1) and frame (4, 11–14) comprise co-operating locating means such as a plug (2) and socket (3) which locate one end of the body (1). To enable the locating means (2, 3) to be guided into correct engagement without the support member (9) needing to be very accurately positioned relative to the locating means (3) on the frame and then to maintain the support member (9) in firm engagement with the body (1), the support member (9) is rotatable within a restricted range about an axis which is substantially parallel to the groove (7) and spaced from it, the axis itself being movable in the plane of the groove (7), and bias is proided to resiliently urge the support member (9) against the body (1). This may be achieved by providing in the support member (9) a further groove (19) through which a resiliently deformed rod (21) extends so that the support member (9) can rotate about the rod (21), suitably at a small region mid-way therealong. The rotation of the support member (9) is restricted by lugs (25, 26) on the member (9) engaging the sides of a channel (29) in an adjacent frame member (11).

14 Claims, 3 Drawing Figures

SUPPORTING ASSEMBLY

The invention relates to an assembly for supporting a body having an approximate predetermined dimension, particularly but not exclusively for supporting a printed circuit board (PCB) or the like having an electrical connector at one end thereof.

Modern electronic equipment is frequently constructed using one or more PCBs. To enable a PCB to be readily assembled with further circuitry of the equipment, to be separately tested and to be readily replaced if faulty, a PCB may be provided at one end with a multi-pin plug for co-operation with a corresponding socket mounted in a supporting assembly housing the PCB(s). To support the PCB and to enable the plug and socket to be guided into mutual engagement, the supporting assembly normally comprises juxtaposed grooved members for receiving opposed side edges of the PCB. The width of the PCB between parallel opposed side edges and its thickness may typically be standardised with fairly tight tolerances, for example in the so-called "Eurocard" system. (In this system, the PCB may be of single or double width with a single plug or two plugs respectively, the position of each plug being accurately defined in relation to the edges of the PCB.) Each socket suitably is rigidly mounted, since if a socket is mounted in a "floating" manner allowing some sideways movement, wires attached to the socket may be liable to be damaged, especially if the equipment is subjected to shock or vibration in use.

The problem then arises of how to provide grooves in the supporting assembly that enable the plug and socket to be guided into engagement and that support the PCB in such a manner that an edge of the PCB is very unlikely to come out of a groove in use but that the plug and socket connector is not subjected to undue stress. The problem particularly involves the tolerances on the relative positions of the grooves and the sockets, and is especially severe if a plurality of PCBs are to be mounted in a common supporting assembly in mutually spaced relationship. The grooves may for example be accurately machined to the thickness of the PCB, with parallel side walls, in rigidly fixed support members, but this requires very tight tolerances in manufacture and assembly, and is very expensive and time-consuming. Moreover, either such guides cannot accept PCBs of greater than normal thickness, or if they are made wide enough to do so, do not provide good clamping of PCBs of lesser thickness. An alternative is to provide a groove of somewhat greater width than the thickness of the PCB with one side wall of the groove being formed with a plurality of leaf springs which are mutually spaced along the groove and which urge the PCB towards the opposite side wall of the groove. This has the disadvantage that it allows for relative mis-positioning of the socket and the groove in a direction perpendicular to the side walls of the groove in only one sense; if there is mis-positioning in that sense, one face of the PCB may not be in contact with the continuous side wall of the groove and the PCB will then not be well supported, while if there is mis-positioning in the opposite sense, the same face of the PCB will be pressed hard against the continuous side wall of the groove, and the plug and socket connector will be subjected to substantial stress. A further alternative is to form leaf springs in each side wall of the groove. This has the advantage of allowing mis-positioning in both senses in said direction, but tends to provide only weak support for the PCB. With a groove having leaf springs in one side wall, in the case where the PCB is not held firmly against the other side wall, and especially with a groove having leaf springs in both side walls, the PCB will tend to oscillate and flex vigorously when the supporting structure is subjected to vibration, and an edge of the PCB may even come out of the groove. Furthermore, guides with leaf springs are generally mounted on supports which extend in said direction perpendicular to the side walls of the groove; when a plurality of PCBs are mounted parallel to one another fairly close together, these supports can significantly obstruct air flow which may be desirable for cooling the circuitry on the PCBs.

According to the invention, a supporting assembly for supporting a body having an approximate predetermined dimension comprises frame means and at least one support member movably mounted in the frame means, the support member having an elongate groove extending along and into the support member to receive first co-operating edge means of the body for supporting the body edgewise, wherein the support member is rotatable relative to the frame means within a restricted range of positions about an axis which extends substantially parallel to the groove and which is substantially in the plane in which the groove extends into the support member, the axis being spaced from the groove, and wherein the axis is movable in the plane, the assembly further comprising bias means for providing a bias in the plane to resiliently urge the support member against the body to be supported, wherein the groove is shaped to maintain firm engagement with the edge means for rotational positions of the support member within the restricted range, wherein the assembly comprises further support means in the frame means for supporting a side of the body remote from the first edge means, the distance between the first edge means and the side being approximately the predetermined dimension, and wherein the frame means comprise first locating means which are co-operable with second locating means on the body disposed generally at an end thereof in the direction in which the groove extends along the support member to locate at least the portion of the body in the region of the first locating means substantially in a predetermined position, whereby to permit the co-operating edge, received in the groove, to be located anywhere within a first range of positions extending in a first direction generally normal to the plane with relatively low bias in the first direction and to be located anywhere within a second range of positions extending in a second direction generally in the plane and normal to the axis with relatively larger bias in the second direction.

The ability of the grooved support member to rotate about an axis spaced from the groove can enable the co-operating locating means to determine the position of at least the portion of the body in the region of the locating means for a relatively wide range of relative positions of the mounting of the support member and the first locating means of the frame means without a large force being applied in the first direction generally normal to the plane. Having adapted its own position to suit the particular dimensions of the configuration, the grooved support member then supports the body along the edge means with substantial bias in the plane helping to maintain firm engagement between the support member and the edge means.

The edge means may be a continuous edge or may for example comprise a plurality of collinear mutually spaced projections on the body.

The restricted range of rotational positions of the support member must of course extend up to less than 45 degrees (in each sense) from a central position in which the bias is applied generally normally to the body, in order that the edge means should not be urged out of the groove by the bias.

The further support means for supporting a side of the body remote from the edge means may for example comprise a bracket which can be secured in the frame means in any position within a range extending generally in the first direction and to which the side of the body can be secured in any position within a range extending generally in the second direction. Suitably, however, the further support means comprise reaction means against which in use said side of the body is urged by said bias means.

For supporting a the body having on the side thereof second edge means substantially coplanar with the first edge means, the reaction means suitably comprise a further said support member with respective bias means so disposed that the body can be supported by and between the two support members with the first and second edge means respectively received in the grooves of the support members.

The two co-operable locating means may comprise respectively a plug and socket, for example where the body is a printed circuit board.

To engage the first edge means of the body in the receiving groove of the one support member, the support member and the further support means may be pushed further apart against the bias and the body be sprung into position. Suitably, where the first locating means are disposed for co-operating with the second locating means at an end of the body in the direction in which the groove extends along the support member, the end of the groove in each support member that is remote from the first locating means is open for enabling the edge means of said body to be slidably received in the groove and thereby for enabling the second locating means to be guided towards the first locating means.

Suitably, each support member is substantially rigid. This can help to inhibit flexing of the body relative to the plane of the groove in each support member.

In an assembly embodying the invention, the support member may have a further elongate groove disposed substantially in the plane parallel to the receiving groove and extending into the support member in the opposite sense to the receiving groove, wherein the bias means comprise an elongate resilient member extending through the further groove and being supported at each end in the frame means, wherein the resilient member engages the support member over only a small region of each member to define the axis about which the support member is rotatable and to provide the bias, wherein the support member has at least one lug at at least one end of the further groove and wherein the frame means have stop means, the lug being disposed between and co-operating with the stop means to restrict the range of movement of the support member, including the range of rotation about the axis. The elements of this construction can be relatively simple and cheap to manufacture and assemble. The stop means may comprise a frame member of the frame means, the frame member having a channel in which at least one lug is disposed.

In such assemblies, the support member may be so shaped that the support member is rotatable over a small range in a plane about said region. This enables the support member to maintain contact with the body along the edge means when the angular disposition of the edge means and the remote side of the body relative to one another is not exactly as expected, for example when the opposite side edges of a PCB are not exactly parallel.

Suitably, the width of the receiving groove decreases with increasing extent into the support member. This enables the support member adequately to support bodies having edge means with a range of thicknesses, and may be suitable shaped to enable firm engagement with edge means for any rotational position of the support member within a restricted range. The maximum angular range of rotation of the support member about an axis is then suitably not substantially more than the maximum angle of mutual inclination of sides of the groove. In the case of, for example, a PCB, this will prevent a situation in which an edge of the groove bits into the PCB. In a particular constructed embodiment, it was found suitable for opposite side edges of the receiving groove to be planar and to be inclined to each other at an angle of substantially 40 degrees.

In an assembly as set forth above wherein the stop means comprise a frame member of the frame means, the frame member having a channel in which at least one lug is disposed, the assembly being adapted for supporting a plurality of bodies with mutual separation and having at least one respective support member with a groove for each body, the respective support members may be mounted in and mutually spaced along the frame member in a direction generally normal to said planes in which the grooves extend with the respective at least one lug of each support member disposed in the channel, the channel being common to all the support members. If suitable means for supporting the ends of the elongate resilient members are provided in the frame means at closely-spaced positions (for example a series of bores in a frame member extending generally normal to the planes of the grooves), the spacing between adjacent bodies may be readily selected from a plurality of values.

An embodiment of the invention will now be described, by wa of example, with reference to the diagrammatic drawings, in which.

Figure 1:
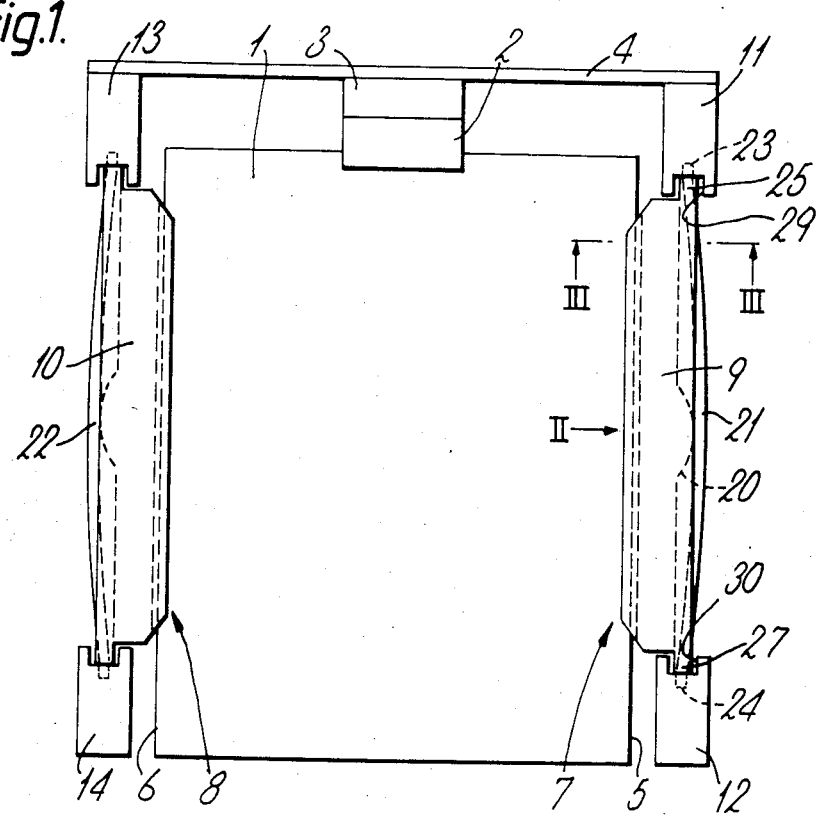
FIG. 1 is a plan view of a printed circuit board supported in an assembly embodying the invention.

Referring to FIG. 1, a printed circuit board 1 has at one end a multi-pin plug 2 which co-operates with a corresponding socket 3. The plug 2 is firmly attached to the PCB 1, and the socket 3 is firmly attached to a sheet 4 forming a so-called "backplane" of a frame in which the PCB is supported. The PCB has parallel side edges 5, 6; the width of the board between the edges 5 and 6 and the thickness of the board are standardised. Each of the edges 5, 6 is received in a respective groove 7, 8 in a respective substantially rigid support member 9, 10. Each of the support members 9, 10 is mounted (in a manner to be described below) in a respective pair of frame members 11, 12 and 13, 14 respectively, each frame member extending normal to the plane of the PCB. The backplane sheet 4 and further members (not shown) interconnecting the frame members 11–14 form the frame in which the PCB 1 is supported.

Figure 2:
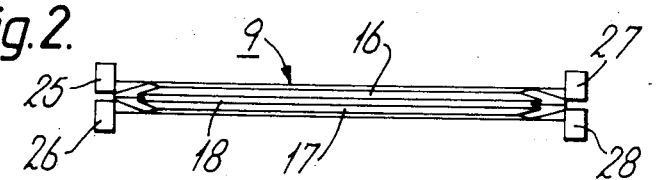
FIG. 2 is a side view of a grooved support member of the supporting assembly shown in FIG. 1, viewed in the direction of the arrow II.

Referring to all the Figures, each of the support members 9, 10 is of predominantly elongate, thin, parallel-faced form. Referring in particular to the member 9 shown in side view and cross-section in FIGS. 2 and 3 respectively, the groove 7, for receiving the co-operating edge 5 of the PCB, extends along the member over most of its length and into the member in the direction of the arrow II in FIG. 1 in a plane parallel to the major surfaces of the member. The groove 7 has opposed planar side walls 16, 17 mutually inclined so that the width of the groove decreases with increasing extent into the member, and has a planar bottom wall 18 normal to the plane of the groove. A further elongate groove 19 extends into the support member from the longitudinal side thereof remote from the receiving groove 7 in the same plane as, in the opposite sense to, and parallel to, the receiving groove. The further groove 19 is mostly of uniform rectangular shape along its length, but mid-way along the support member the bottom wall of the groove has an arcuate hump 20 such that passing along the groove from one side of the hump to the other, the depth of the groove decreases substantially to zero before increasing again to the full value.

Figure 3:
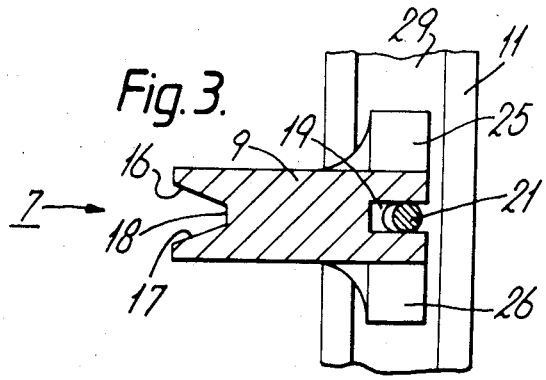
FIG. 3 is a cross-sectional view of the support member on the line III—III in FIG. 1, together with a side view of an adjacent frame member of the assembly, on an enlarged scale.

Each of the support members 9, 10 is movably mounted in the frame of the supporting assembly by means of a respective resilient rod 21, 22 (in this embodiment of circular cross-section) which extends along the further groove of the support member and which is supported at each end in the frame, in this case a blind bore in each frame member adjacent the end of the support member, the bores in the frame members 11, 12 which support the resilent rod 21 and thereby the support member 9 being denoted 23, 24 respectively. Each support member has at each end a pair of lugs disposed one above and the other below the plane of the grooves in the support member, the pairs of lugs on the support member 9 being denoted 25, 26 and 27, 28 respectively. Each pair of lugs is disposed in a channel in the respective adjacent frame member, the channels in the frame members 11, 12 being denoted 29, 20 respectively. The channels, are of greater width than the lugs; the lugs and channels co-operate to restrict the range of movement of the support member, both as regards translation in the plane of the grooves and as regards rotation. In view of the curved hump 20, rotation of the support member 9 is about the axis of the small region of the rod that contacts the hump 20. The arrangement is such that for all positions of the pairs of lugs in their respective channels, the rod is forced to have a curved shape and hence to provide a bias force resiliently urging the support member against the PCB, the force being in the plane of the grooves 7, 19. When the rod 20 is least sharply curved (when the support member 9 is furthest to the left in FIGS. 1 and 3), the portions of the rod adjacent the frame members 11, 12 are disposed at the top of the groove 19, just wholly within it; when the rod 20 is most sharply curved (when the support member 9 is furthest to the right in FIGS. 1 and 3), these portions of the rod are disposed at the bottom of the groove 19. The supporting assembly is designed so that when the actual width of the PCB is equal to its nominal, standardised value, the lugs are disposed (as depicted in FIG. 3) in a position mid-way between the side walls of their respective channels, the position which allows the greatest extent of rotation of the support member. The total angular extent is arranged to be not substantially more than, and suitably substantially equal to, the angle of mutual inclination of the side walls 16, 17 of the receiving groove 7, so that when the support member is at either end of the range of rotation, the portions of the support member at the top of the side walls of the groove will not substantially tend to indent the PCB.

The shaped hump 20 also allows a small range of rotation of the support member 9 in the plane of the grooves 7 and 19 about the small region of engagement between the hump 20 and the rod 21. This allows the support members 9, 10 to maintain engagement along their respective grooves 7, 8 with the side edges of the PCB even if these edges are slightly inclined to each other rather than being parallel.

The ends of each of receiving grooves 7, 8 in the support members 9, 10, in particular the end of each groove remote from the socket 3, is champfered to provide a gap of greater width than the groove and of greater distance from the corresponding region on the other support member than the distance between the grooves respectively of the two support members and hence to enable the PCB readily to be inserted. Once the side edges of the PCB have been received in the grooves, the mounting and the rigidity of the support members maintains the edges of the PCB in the same plane so that the PCB substantially cannot be twisted out of a planar form, and the pins of the plug 2 are maintained substantially parallel to the axes of the corresponding apertures in the socket 3 that they are to enter. The plug and socket 2 and 3 suitably are provided in known manner with co-operable inclined edges so that, as the plug is brought up to the socket, the pins of the plug are guided into correct entry into their respective apertures in the socket from anywhere within restricted ranges of mis-alignment in each of the two mutually orthogonal directions normal to the axes of the pins. The ranges of lateral movement of a PCB enabled by movement of the support members, at least with a PCB of width equal to the nominal value, suitably are at least as great as the above-mentioned ranges of possible mis-alignment within which the plug and socket can be guided into correct engagement. Once the plug and socket are engaged and hence locate the rear edge of the PCB, the adjacent rear ends of the support members are constrained by the stiffness of the PCB, whose side edges are engaged in the receiving grooves in the support members, each to take up an appropriate rotational and lateral position. Since the support members themselves are substantially rigid, and there is little play in the mounting of the support members, this means that the remainder of that part of each side edge of the PCB that is engaged in the receiving groove is held quite firmly in position.

The angle of mutual inclination of the side walls of the receiving groove may be chosen bearing in mind the following criteria:

(a) It should preferably be at least as large as the angular range of rotation of the support members which will cover the range of mis-alignment of the plug and socket within which correct engagement can still be obtained.

(b) If the angle is relatively small, the edge of the PCB may tend to jam in the groove as it is inserted (depending on the materials of the PCB and support member).

(c) The larger the angle, the more easily (with a given bias force) the edge of the PCB will, when the PCB is subjected to shock or vibration, ride up one side wall of the groove and away from the other side wall (the support member rotating), and hence the larger will be the magnitude of displacement of the PCB.

(d) The smaller the angle, the greater will be the depth of the groove required to provide a given range of groove widths (to cater for different thickness of PCB), and hence the further the groove walls will in general extend over the PCB from its side edge, reducin the probability of the board jumping out of the groove under vibration or shock.

The use of supporting members each rotatable about an axis spaced from the receiving groove of the supporting member and movable in the plane of the groove, and of a receiving groove of decreasing width, enables such a supporting assembly to accept PCBs with a much greater deviation in width and thickness from the standardised values than can be catered for with conventional supporting assemblies.

The above-described supporting assembly is well suited to be adapted to support a plurality of PCBs in mutually spaced substantially parallel relationship, each PCB being supported in a respective pair of support members each mounted on a respective resilient rod. By providing the frame members with corresponding bores, in which the resilient rods can be mounted, at closely spaced intervals along the channels in the frame members, the spacing between adjacent PCBs may be readily selected in accordance, for example, with the extent normal to the PCBs of components mounted thereon and with a suitable width of gap between the PCBs for the flow of air for cooling the components.

It will be appreciated that such an assembly also has the advantage of providing very little obstruction to the flow of cooling air over the PCB(s).

In an assembly for supporting a plurality of PCBs, the backplane may itself be a printed circuit board (a so-called "motherboard") providing appropriate interconnections between the PCBs ("daughter boards") supported in the assembly.

For restricting the range of rotation of the support members, instead of providing lugs on the support members that are disposed in a channel in the adjacent frame member, the frame may comprise "fingers" which are disposed respectively to engage the upper and lower parallel major faces of the support member at the desired limits of travel. However, this has the disadvantage that the fingers need to be quite accurately positioned, which may be particularly inconvenient with a plurality of PCBs supported in a frame, furthermore, such an arrangement does not lend itself well to selectable spacings between adjacent PCBs.

In a particular constructed embodiment, the support members were moulded from a plastics material available under the Registered Trade Mark "Noryl". The side walls of the receiving groove were planar and mutually inclined nominally at an angle of approximately 39 degrees (i.e. substantially 40 degrees). The resilient rods on which the support members were mounted were made of stainless steel spring wire (BS 2056: 316s42) having a diameter of 2.0±0.1 mm, the width of the further groove in the support member in which each rod was located was 2.0-2.1 mm, and its depth along most of its length was 4 mm, apart from the hump mid-way along its length that had a radius of about 20 mm. The width of the channels in the frame members in which the lugs of the support members were disposed was 6 mm, and the width of the lugs was 4 mm, the overall extent of the support member along the channel being about 14 mm.

Shock and vibration tests on such a constructed embodiment supporting a plurality of mutually parallel PCBs spaced at intervals along the frame members showed that the supported PCBs were able to withstand an acceleration of 35 g without the PCBs coming out of the receiving grooves in the supporting members, and that under vibration the PCBs oscillated and flexed substantially less than when mounted in a conventional supporting assembly.

If it is desired to further improve cooling of the PCB, the support members may be made of a material of good thermal conductivity, in order more readily to conduct heat from the side edges of the PCB to the frame of the supporting assembly. The thermal conductance of this path may be further increased by assembling each support member and its associated rod with a paste of reasonable thermal conductivity.

The supporting assembly described with reference to the drawings may be used to support electrical circuit assemblies other than PCBs, for example power supply units, that are formed as bodies having two edge means respectively co-operable with the receiving grooves of the two support members.

More generally, an assembly embodying the invention may be used to support any body having edge means co-operable with a grooved support member where at least dimension of the body between the edge means and an opposite side of the body that can be supported by further support means has approximately a predetermined value.

I claim:

1. a supporting assembly for supporting a body having approximately a predetermined dimension, comprising frame means and at least one support member movably mounted in the frame means, the support member having an elongate groove extending along and into the support member to receive first co-operating edge means of the body for supporting the body edgewise, wherein the support member is rotatable relative to the frame means within a restricted range of positions about an axis which extends substantially parallel to the groove and which is substantially in the plane in which the groove extends into the support member, said axis being spaced from the groove, and wherein said axis is movable in said plane, the assembly further comprising bias means for providing a bias in said plane to resiliently urge the support member against the body to be supported, wherein the groove is shaped to maintain firm engagement with said edge means for rotational positions of the support member within said restricted range, wherein the assembly comprises further support means in the frame means for supporting a side of the body remote from the first edge means, the distance between the first edge means and said side being approximately said predetermined dimension, and wherein the frame means comprise first locating means which are co-operable with second locating means on said body disposed generally at an end thereof in the direction in which the groove extends along the support member to locate at least the portion of the body in the region of the first locating means substantially in a predetermined position, whereby to permit said co-operating edge means, received in the groove, to be located anywhere within a first range of positions extending in a first direction generally normal to said plane with relatively low bias in the first direction and to be located anywhere within a second range of positions extending in a second direction generally in said plane and normal to said axis with relatively larger bias in the second direction.

2. An assembly as claimed in claim 1 wherein the further support means comprise reaction means against which in use said side of the body is urged by said bias means.

3. An assembly as claimed in claim 2 for supporting a body having on said side thereof second edge means substantially coplanar with the first edge means, wherein the reaction means comprise a further support member with an elongate groove and respective bias means so disposed that the body can be supported by and between the two support members with said first and second edge means respectively received in the grooves of the support members.

4. An assembly as claimed in claim 3 wherein the two co-operable locating means comprise respectively a plug and a socket.

5. An assembly as claimed in claim 3 wherein the end of the groove in each support member that is remote from the first locating means is open for enabling each said edge means of said body to be slidably received in a respective groove and thereby for enabling the second locating means to be guided towards the first locating means.

6. An assembly as claimed in claim 5 wherein each support member is substantially rigid.

7. An assembly as claimed in claim 6 wherein each support member has a further elongate groove disposed substantially in said plane parallel to the receiving groove and extending into the support member in the opposite sense to the receiving groove, wherein the bias means compirse an elongate resilient member extending through the further groove and being supported at each end in the frame means, wherein the resilient member engages the support member over only a small region of each member to define said axis about which the support member is rotatable and to provide said bias, wherein the support member has at least one lug at at least one end of the further groove and wherein the frame means have stop means, the lug being disposed between and co-operating with the stop means to restrict the range of movement of the support member, including the range of rotation about said axis.

8. An assembly as claimed in claim 7 wherein the stop means comprise a frame member of the frame means, the frame member having a channel in which said at least one lug is disposed.

9. An assembly as claimed in claim 8 wherein each support member is so shaped that the support member is rotatable over a small range in said plane about said region.

10. An assembly as claimed in claim 9 wherein the width of the receiving groove between opposed sides thereof decreases with increasing extent into the support member.

11. An assembly as claimed in claim 10 wherein the maximum angular range of rotation of the support member about said axis is not substantially less than the maximum angle of mutual inclination of said sides.

12. An assembly as claimed in claim 11 wherein said opposite sides of the receiving groove are planar and inclined to each other at an angle of substantially 40 degrees.

13. An assembly as claimed in claim 12 in combination with a body supported therein.

14. An assembly as claimed in claim 8 for supporting a plurality of bodies with mutual separation, the assembly having at least one and a further said support member for each body, wherein the respective support members each have a groove and are mounted in and mutually spaced along the frame member in a direction generally normal to said with the respective at least one lug of each support member disposed in said channel, the channel being common to all the support members.

* * * * *